(12) United States Patent
Ochs et al.

(10) Patent No.: US 8,076,002 B2
(45) Date of Patent: Dec. 13, 2011

(54) LAMINATES COMPRISING THERMOPLASTIC POLYSILOXANE-UREA COPOLYMERS

(75) Inventors: Christian Ochs, Burghausen (DE); Ralph Hiemeyer, Munich (DE); Oliver Schaefer, Burghausen (DE)

(73) Assignee: Wacker Chemie AG, Munich (DE)

( * ) Notice: Subject to any disclaimer, the term of this patent is extended or adjusted under 35 U.S.C. 154(b) by 291 days.

(21) Appl. No.: 12/444,481

(22) PCT Filed: Oct. 9, 2007

(86) PCT No.: PCT/EP2007/060693
§ 371 (c)(1),
(2), (4) Date: Apr. 6, 2009

(87) PCT Pub. No.: WO2008/043749
PCT Pub. Date: Apr. 17, 2008

(65) Prior Publication Data
US 2010/0047589 A1 Feb. 25, 2010

(30) Foreign Application Priority Data
Oct. 11, 2006 (DE) .......................... 10 2006 048 216

(51) Int. Cl.
*B32B 9/04* (2006.01)
*B32B 17/06* (2006.01)
*B32B 37/02* (2006.01)

(52) U.S. Cl. ..................... 428/429; 428/447; 156/308.2

(58) Field of Classification Search ................. 428/447, 428/429; 156/308.2
See application file for complete search history.

(56) References Cited

U.S. PATENT DOCUMENTS

| | | | |
|---|---|---|---|
| 4,057,439 A | 11/1977 | Lindmayer | |
| 4,322,261 A | 3/1982 | Dubois | |
| 4,395,527 A * | 7/1983 | Berger | 528/26 |
| 5,474,620 A * | 12/1995 | Nath et al. | 136/251 |
| 6,340,403 B1 | 1/2002 | Carey et al. | |
| 7,511,298 B2 * | 3/2009 | Kawaraya et al. | 257/43 |
| 2003/0075210 A1 | 4/2003 | Stollwerck et al. | |
| 2004/0028918 A1 | 2/2004 | Becker et al. | |
| 2004/0210024 A1 | 10/2004 | Schafer et al. | |
| 2004/0254325 A1 | 12/2004 | Kuepfer et al. | |
| 2005/0074591 A1 | 4/2005 | Zagdoun et al. | |
| 2007/0131274 A1 | 6/2007 | Stollwerck et al. | |
| 2008/0276983 A1 * | 11/2008 | Drake et al. | 136/251 |

FOREIGN PATENT DOCUMENTS

| | | |
|---|---|---|
| DE | 19919742 A | 11/2000 |
| DE | 19963866 A | 8/2001 |
| DE | 20220444 U1 | 10/2003 |
| DE | 10250564 A | 5/2004 |
| DE | 103524423 B3 | 1/2005 |
| DE | 10342401 A | 4/2005 |
| DE | 102004053708 A | 5/2006 |
| EP | 1412416 B | 9/2004 |
| EP | 1328483 B | 12/2005 |
| EP | 1489129 B | 4/2006 |

OTHER PUBLICATIONS

Ullmann's Encyclopedia of Industrial Chemistry, 5th edition, 1992, vol. A24, pp. 393-395.
Ullmann's Encyclopedia of Industrial Chemistry, 5th edition, 1991, vol. A18, pp. 201-202.
Ullmann's Encyclopedia of Industrial Chemistry, 5th edition, 1991, vol. A18, pp. 204-205.
Ullmann's Encyclopedia of Industrial Chemistry, 5th edition, 1992, vol. A20, pp. 164-175.
Ullmann's Encyclopedia of Industrial Chemistry, 5th edition, 1988, vol. A11, pp. 87-93.

* cited by examiner

*Primary Examiner* — Thao T. Tran
(74) *Attorney, Agent, or Firm* — Brooks Kushman P.C.

(57) ABSTRACT

Photovoltaic modules are prepared by laminating an active device to a glass cover plate by means of a thermoplastic siloxane copolymer. The siloxane copolymer provides good adhesion, freedom from water absorption, and yet can be reworked either in the field or during recycling of the solar cell components.

12 Claims, No Drawings

LAMINATES COMPRISING THERMOPLASTIC POLYSILOXANE-UREA COPOLYMERS

CROSS-REFERENCE TO RELATED APPLICATION

This application is the U.S. national phase of PCT Appln. No. PCT/EP2007/060693 filed Oct. 9, 2007 which claims priority to German application DE 10 2006 048 216.6 filed Oct. 11, 2006, which are incorporated herein by reference.

BACKGROUND OF THE INVENTION

1. Field of the Invention

The invention relates to laminates which contain at least one layer of thermoplastic polysiloxane-urea copolymers and at least one further layer of one or more solar cell units, a process for the production thereof and their use.

2. Description of the Related Art

In general, a multilayer material which forms as a result of lamination, i.e. pressing and simultaneous adhesive bonding, of at least two layers of identical or different materials is designated as a laminate (lat. lamina: layer). Glass laminates have long been known and are used widely as so-called laminated safety glasses in automotive, vehicle and aircraft construction and in the building industry. Laminated glass has a sandwich-like composition and consists of at least one glass panel and a polymeric layer present thereon. Plasticized polyvinyl butyral (PVB) in sheet form is most frequently used as the polymeric intermediate layer. Furthermore, the intermediate layer may also consist of polyurethane or polyacrylate or of a combination of a plurality of different materials.

Photovoltaic solar modules are laminates which have a layer-like structure similar to the laminated glasses but additionally contain at least one photosensitive semiconductor layer which is connected in a suitable manner via contacting tracks to one or more photovoltaic cells (referred to below as "solar cell units"). Laminates having this structure are also known in general usage by the terms "photovoltaic module", "solar cell module", "solar module", "solar panel" or the like. In this context, reference may be made, for example, to Ullmann's Encyclopedia of Industrial Chemistry, 5th edition, 1992, vol. A24, pages 393-395.

A photovoltaic solar module consists as a rule of one or more solar cell units which are connected to one another and are provided with a transparent protective covering for protection from external influences. Here, the solar cell units are frequently laminated between a glass plate and a more or less rigid, rear covering sheet which can likewise consist of glass or organic polymers/copolymers, such as, for example, those based on polyvinyl fluoride (PVF) or polyethylene terephthalate (PET), with the aid of a transparent adhesive layer (rigid solar module). In addition, flexible solar modules which are bendable within certain limits are also known. These consist of the front, protective cover layer, for example transparent organic (co)polymers, while the rear covering sheet consists of a thin metal or plastic sheet or a suitable plastic-based and/or metal-based composite material.

The transparent adhesive layer required for lamination has a plurality of functions and the requirements which the materials must meet are accordingly high. Thus, the adhesive layer acts firstly as a protective embedding material for the extremely sensitive solar cell units by completely enclosing them and substantially insulating them from external influences, such as the penetration of moisture and oxygen. At the same time, however, it must not adversely affect the optical properties of the photosensitive materials. Furthermore, the embedding material used must be highly transparent and UV-stable over decades and must guarantee the permanent cohesiveness of the sandwich-like material composite over the entire life time of the photovoltaic solar module. Further requirements are simple processibility, good adhesion to the relevant substrates and high transparency and freedom from bubbles after the lamination step.

Organic casting resins, for example based on polyurethanes, polyesters, polycarbonates, epoxides and acrylates, and crosslinkable silicone-based systems, such as, for example, silicone gels, are frequently used as transparent adhesive or embedding material. These adhesive systems can be adjusted in the uncured state to have such a low viscosity that even very small cavities are completely filled and the solar cell units enclosed without bubbles. Vulcanization is then induced by curing agents or crosslinking agents already present in the adhesive system or later introduced, and a mechanically strong adhesive layer is obtained.

A disadvantage of these embedding materials is the complicated production of corresponding solar modules, since the lamination step requires the handling of multicomponent systems and considerable care when placing or potting the solar cell units; this applies in particular to large-area elements. In the case of the organic casting resin systems, curing is moreover a process which is difficult to control. In addition, some of the casting resins have a tendency toward bubble formation, cloudiness or delamination after years.

An alternative to curing systems is—in analogy to the production of laminated safety glass—the use of thermoplastic films based on organic polymers or copolymers, in particular on polyvinyl butyral (PVB) or ethylene-vinyl acetate (EVA). For this purpose, the solar cell units are embedded between the polymer sheets and then bonded at elevated pressure and elevated temperature with the desired covering materials to give a laminate. The use of thermoplastic EVA or PVB sheets is, however, associated with some disadvantages which adversely affect both the quality and the production costs of photovoltaic solar modules.

The EVA widely used in solar module construction contains organic peroxides in order to subsequently crosslink the originally thermoplastic material during the lamination step and thus substantially to improve the creep resistance of the embedding material. However, the peroxide is often not completely consumed during the lamination, so that any excess peroxide can promote subsequent oxidation or decomposition, but in particular, yellowing of the EVA. Thus, for example, it is known that EVA subsequently crosslinked with peroxide becomes yellow under extensive exposure to sunlight over the years, as occurs, for example, during the operation of solar modules in the open air. However, this leads to a gradual decrease in the solar energy efficiency of the module. Furthermore, owing to the peroxide-induced postcrosslinking which takes place simultaneously, the lamination step must be affected in vacuo. The reason for this lies in the fact that atmospheric oxygen adversely affects the free radical crosslinking reactions and reduces the degree of crosslinking and hence the creep resistance of the postcrosslinked EVA. The organic peroxides in turn, like their cleavage and degradation products, are relatively reactive compounds which often lead to premature wear of the membranes present in the EVA lamination apparatuses. In addition, under production conditions, EVA may release small amounts of acetic acid which may subsequently promote metal contact corrosion in the solar cell units. In addition, the melting, the relatively slow crosslinking of the EVA and the lamination of the material composite at about 150° C. and in vacuo lead to cycle times of about 15 to 30 minutes per module.

The PVB widely used at the beginning of the development of solar module construction likewise has a serious disadvantage: PVB is known to be extremely hygroscopic and has a strong tendency toward moisture absorption.

It must therefore be stored under defined, climatic conditions up to the lamination step. Furthermore, it is known from adverse experience from the laminated glass sector that PVB can slowly absorb moisture even in the laminated state and thus becomes cloudy to a greater or lesser extent. The cloudiness in turn reduces the light transmittance of the laminate layer significantly so that, in such a case, the solar energy efficiency of the module is markedly reduced. In order therefore to keep the influence of atmospheric humidity on the laminating medium as small as possible for the complete life time of the solar module, special sealing systems or additional edge seals comprising other sealants are required. This makes the construction of corresponding solar modules complicated and expensive.

A thermoplastic polyurethane system (TPU) which can be processed just as easily as PVB but at the same time is said not to have the problems described above which are known for PVB has been described as an alternative to PVB. In this context, reference may be made to DE 20220444 U1. The thermoplastic polyurethanes used are reaction products of aliphatic diisocyanates with organic polyols, it being possible, if appropriate, for additional chain extenders based on organic polyols to be present. A disadvantage of the adhesive system described is, however, the use of purely organic synthesis building blocks, which results in reduced long-time UV stability and therefore necessitates the addition of additional UV stabilizers. This in turn—incidentally as in the case of EVA—leads to a reduced transparency of the laminates in the high-frequency visible and UV-A and UV-B range which is of interest in particular for solar cells not based on silicon. Furthermore, the use of organic polyols as a synthesis building block is disadvantageous as these compounds are known to be polar and hydrophilic, which counteracts a water vapour diffusion barrier effect and thus long-term weathering stability of the laminates disclosed. Furthermore, the class of substances used and comprising TPUs has a relatively high glass transition temperature and hence limited flexibility, in particular at low temperatures. However, since the modulus of elasticity close to the glass transition temperature is strongly temperature-dependent, the result of this may be that, during operation of such a solar module at low outside temperature (e.g. below 0° C.) the adhesive layer becomes very taut and the fragile solar cells and the connecting conductors are also adversely affected, which can lead to total failure of the module or incipient delamination.

SUMMARY OF THE INVENTION

The invention relates to a laminate comprising
(A) at least one layer containing inorganic and/or organic glass,
(B) at least one layer containing a thermoplastic siloxane copolymer,
(C) at least one unit containing at least one photosensitive layer
and optionally
(D) at least one further layer selected from the group consisting of organic polymers, organosilicon polymers, metallic materials, mineral materials and wood.

Inorganic or organic glass (A) in the context of the present invention are hardened and unhardened mineral glasses and organic glasses based on transparent organic polymers and copolymers.

Examples of mineral glasses are industrial glasses, such as quartz glass, soda-lime glass, borosilicate glass, aluminosilicate glass, lead borate glass, float glass, toughened safety glass and partly prestressed glass and glass-ceramic glasses. Further examples are the examples which are mentioned in Ullmann's Encyclopedia of Industrial Chemistry, 5th edition, 1991, vol. A 18, pages 201-202, for optical glasses which are incorporated herein by reference.

Examples of organic glass are glasses consisting of polycarbonate, acrylic glass such as that obtainable under the brand Plexiglas® from Degussa AG, Germany, polyester, polyamide, polystyrene, polyacrylates, polymethyl methacrylates, PVC, polypropylene, polyethylene, polyethylene terephthalate, polymers based on fluorinated hydrocarbons such as those obtainable under the brand Fluon® from Asahi Glass Co., Ltd., Japan, and copolymers of said polymers. Further examples are examples which are mentioned in Ullmann's Encyclopedia of Industrial Chemistry, 5th edition, 1991, vol. A18, pages 204-205, and intended for optical glasses based on organic polymers, which are herein incorporated by reference.

The glasses (A) used according to the invention have a thermal coefficient of expansion of preferably from $-1 \cdot 10^{-6}$ to $100 \cdot 10^{-5}$ $K^{-1}$, in particular from 0 to $100 \cdot 10^{-6}$ $K^{-1}$, at 25° C.

The glasses (A) used according to the invention are preferably highly transparent materials, i.e. glasses having a transmittance$_{D65}$ (according to DIN 5036, Part 3) of at least 80%, more preferably at least 85%, and most preferably of at least 90%.

The glasses used preferably have a melting point or softening point of more than 60° C., more preferably more than 80° C., in each case at the pressure of the ambient atmosphere, i.e. from 900 to 1100 hPa.

According to the present invention, the inorganic or organic glass can be present in sheet, panel or film form. It may also be a colaminate of different glasses (A). Preferably the layer (A) consists of a sheet, or of one or more films.

The layer (A) may consist of a uniform material or may itself have a multilayer structure. Examples of a multilayer structure of (A) are the embodiment of the inorganic glass (A) as laminated safety glass or as antireflective float glass.

The inorganic or organic glass can—if desired—have been surface-treated, for example in order to improve mechanical stability of the layer (A) or in order to reduce losses of efficiency due to light reflection or due to excessive heating of the module. Examples of surface treatments are the application of a scratch-resistant layer and/or of an antireflection layer, as described, for example, in US 2005/0074591 A1, EP 1328483 B1, DE 10250564 A1 and DE 10342401 A1, or of a layer which leads to a self-cleaning effect, the antistatic treatment as described in DE 19963866 A1, the application of an antifogging coating as described in DE 102004053708 A1 or the modification of the surface roughness.

The thermoplastic siloxane copolymers used according to the invention may be any thermoplastic compounds, but are preferably thermoplastic siloxane copolymers comprised of compounds of the general formulae

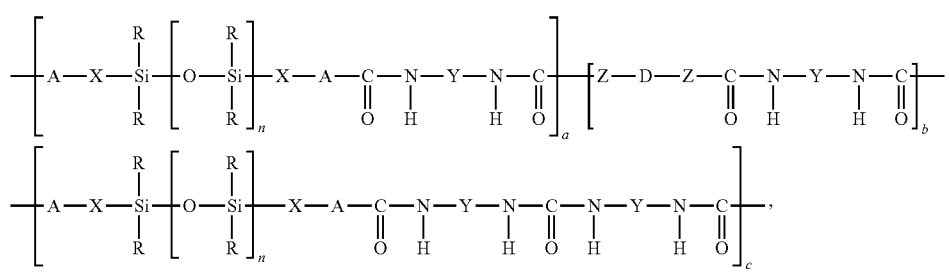

(1)

in which

R may be identical or different and is a monovalent, Si-bonded hydrocarbon radical which is optionally substituted by halogen atoms and may be interrupted by oxygen atoms, X may be identical or different and is an alkylene radical having 1 to 20 carbon atoms, in which non neighboring methylene units may be replaced by —O— groups, A may be identical or different and is an oxygen atom or an amino group —NR', Z may be identical or different and is an oxygen atom or an amino group —NR', R' may be identical or different and is a hydrogen atom or an alkyl radical having 1 to 10 carbon atoms, Y may be identical or different and is a divalent hydrocarbon radical which has 1 to 20 carbon atoms, is optionally substituted by halogen atoms and may be interrupted by oxygen atoms, D may be identical or different and is a divalent hydrocarbon radical which is optionally substituted by halogen atoms or $C_1$-$C_6$-alkyl ester groups and in which non-neighboring methylene units may be replaced by —O—, —COO—, —OCO— or —OCOO— groups, n may be identical or different and is a number from 1 to 4000, a is a number from at least 1, b is 0 or a number from 1 to 1000 and c is 0 or a number from 1 to 1000.

Examples of R are alkyl radicals such as the methyl, ethyl, n-propyl, isopropyl, 1-n-butyl, 2-n-butyl, isobutyl, tert-butyl, n-pentyl, isopentyl, neopentyl, and tert-pentyl radicals; hexyl radicals such as the n-hexyl radical; heptyl radicals such as the n-heptyl radical; octyl radicals such as the n-octyl radical and isooctyl radicals such as the 2,2,4-trimethylpentyl radical; nonyl radicals such as the n-nonyl radical; decyl radicals such as the n-decyl radical; dodecyl radicals such as the n-dodecyl radical; octadecyl radicals such as the n-octadecyl radical; cycloalkyl radicals such as the cyclopentyl, cyclohexyl, cycloheptyl, and methylcyclohexyl radicals; alkenyl radicals such as the vinyl, 1-propenyl and 2-propenyl radicals; aryl radicals such as the phenyl, naphthyl, anthryl and phenanthryl radicals; alkaryl radicals such as the o-, m- and p-tolyl radicals, xylyl radicals, and ethylphenyl radicals; and aralkyl radicals such as the benzyl radical and α- and the β-phenylethyl radicals.

Examples of halogenated radicals R are haloalkyl radicals such as the 3,3,3-trifluoro-n-propyl radical, the 2,2,2,2',2',2'-hexafluoroisopropyl radical, the heptafluoroisopropyl radical, and haloaryl radicals such as the o-, m- and p-chlorophenyl radicals.

Radical R is preferably a monovalent hydrocarbon radical which has 1 to 20 carbon atoms and is optionally substituted by fluorine and/or chlorine atoms, more preferably a hydrocarbon radical having 1 to 6 carbon atoms, and in particular, the methyl, ethyl, vinyl and phenyl radicals.

Examples of radical X are the alkylene radicals stated below for radical Y. Radical X is preferably an alkylene radical having 1 to 10 carbon atoms, more preferably the methylene and n-propylene radicals.

Radical R' is preferably a hydrogen atom.

A is preferably a radical —NR'—, where R' has the abovementioned meaning, more preferably a radical —NH—.

Radical Z preferably has the meaning of —O— or —NH—.

Examples of radical Y are alkylene radicals such as the methylene, ethylene, n-propylene, isopropylene, n-butylene, isobutylene, tert-butylene, n-pentylene, isopentylene, neopentylene, tert-pentylene, hexylene, heptylene, octylene, nonylene, decylene, dodecylene and octadecylene; cycloalkylene radicals such as cyclopentylene, 1,4-cyclohexylene, isophoronylene and 4,4'-methylenedicyclohexylene radicals; alkenylene radicals such as the vinylene, n-hexenylene, cyclohexenylene, 1-propenylene, allylene, butenylene and 4-pentenylene radicals; alkynylene radicals such as the ethynylene and propargylene radicals; arylene radicals such as the phenylene, bisphenylene, naphthylene, anthrylene and phenanthrylene radicals; alkarylene radicals such as the o-, m- and p-toluoylene radicals, xylylene radicals and ethylphenylene radicals; and aralkylene radicals such as the benzylene radical, the 4,4'-methylenediphenylene radical and the α- and the β-phenylethylene radicals.

Radical Y is preferably a hydrocarbon radical having 3 to 13 carbon atoms, more preferably an aralkylene or linear or cyclic alkylene radicals.

Examples of radicals D are the examples stated for Y, and polyoxyalkylene radicals such as polyoxyethylene radicals or polyoxypropylene radicals.

D is preferably a divalent hydrocarbon radical having 1 to 800 carbon atoms, optionally substituted by fluorine atoms, chlorine atoms or $C_1$-$C_6$-alkyl ester groups, or is a polyoxyalkylene radical. When D is an optionally substituted hydrocarbon radical, alkylene radicals having at least 2 to 12 carbon atoms, in particular having at least 4 to 12 carbon atoms, are preferred. Where D is a polyoxyalkylene radical, polyoxyalkylene radicals having 20 to 800 carbon atoms, more preferably 100 to 800 carbon atoms, in particular 100 to 200 carbon atoms are preferred, with polyoxyethylene radicals or polyoxypropylene radicals being very particularly preferred.

Index n is preferably a number from 3 to 800, more preferably from 3 to 400, and in particular from 25 to 250.

a is preferably a number from 1 to 1000, more preferably not more than 250, and in particular not more than 150.

If b is not equal to 0, b is preferably a number of not more than 250, in particular not more than 50.

c is preferably 0 or a number of not more than 10, in particular 0 or a number of not more than 5.

In the compound of the formula (1) which is used according to the invention, the a organopolysiloxane blocks, b polyurea blocks and c polyurethane blocks can be distributed as desired, for example randomly.

Customary terminal groups according to the prior art which form as is standard in the synthesis of such polymers, such as amino or isocyanate terminal groups, may occur as terminal groups of the compound of the formula (1) which is used according to the invention. These can be reacted during the synthesis or subsequently with further groups, such as for example with amino- or isocyanatosilanes. Furthermore, it is possible to add, during the synthesis itself, monofunctional organic compounds which are reactive toward isocyanate groups, for example, primary or secondary alcohols or amines, with the result that the rheological properties and the molecular weight of the thermoplastic siloxane copolymers (B) can also be controlled in an elegant manner. The thermoplastic siloxane copolymers (B) therefore preferably contain a functional or nonfunctional organic or organosilicon radical as a terminal group.

Thermoplastic siloxane copolymers as may be used as component (B) and processes for the production thereof are described, for example, in EP 1412416 B1 and EP 1489129 B1, the disclosure of which is herein incorporated by reference.

Examples of thermoplastic siloxane copolymers of the formula (1) are those in which
R is $CH_3$—, X is —$(CH_2)_3$—, A is —NH—, n is 35-45, b is 0, c is 0,
Y is -p-$C_6H_4$—$CH_2$-p-$C_6H_4$— and a is 40-70 and which are terminated with a hydrogen atom on the radical A and with the radical —$NH(CH_2)_3SiMe_2(OSiMe_2)_{35-45}(CH_2)_3$—$NH_2$ on the carbonyl carbon atom;
R is $CH_3$—, X is —$(CH_2)_3$—, A is —NH—, n is 35-45, b is 0, c is 0,
Y is -p-$C_6H_4$—$CH_2$-p-$C_6H_4$— and a is 40-70 and which are terminated with a hydrogen atom on the radical A and with the radical —$NH(CH_2)_3SiMe_2(OSiMe_2O)_{35-45}(CH_2)_3$—NH—CO—NH—Y—NCO on the carbonyl carbon atom;
R is $CH_3$—, X is —$(CH_2)_3$—, A is —NH—, n is 35-45, b is 0, c is 0,
Y is

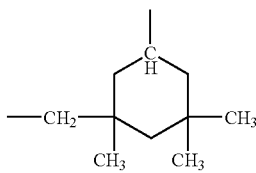

and a is 25-35 and which are terminated with a hydrogen atom on the radical A and with the radical —$NH(CH_2)_3SiMe_2(OSiMe_2)_{35-45}(CH_2)_3$—$NH_2$ on the carbonyl carbon atom;
R is $CH_3$—, X is —$(CH_2)_3$—, A is —NH—, n is 35-45, b is 0, c is 0,
Y is

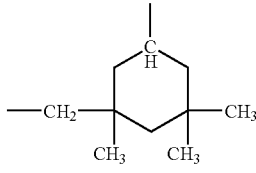

and a is 25-35 and which are terminated with a hydrogen atom on the radical A and with the radical —$NH(CH_2)_3SiMe_2(OSiMe_2O)_{35-45}(CH_2)_3$—NH—CO—NH—Y—NCO on the carbonyl carbon atom;

R is $CH_3$—, X is —$(CH_2)_3$—, A is —NH—, n is 35-45, b is 0, c is 0,
Y is

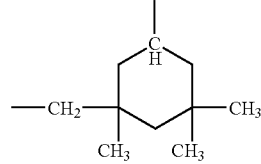

and a is 60-70 and which are terminated with a hydrogen atom on the radical A and with the radical —$NH(CH_2)_3SiMe_2(OSiMe_2)_{35-45}(CH_2)_3$—$NH_2$ on the carbonyl carbon atom;
R is $CH_3$—, X is —$(CH_2)_3$—, A is —NH—, n is 35-45, b is 0, c is 0,
Y is

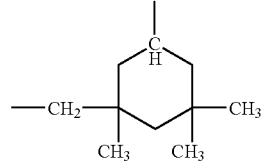

and a is 60-70 and which are terminated with a hydrogen atom on the radical A and with the radical —$NH(CH_2)_3SiMe_2(OSiMe_2O)_{35-45}(CH_2)_3$—NH—CO—NH—Y—NCO on the carbonyl carbon atom;
R is $CH_3$—, X is —$(CH_2)_3$—, A is —NH—, n is 35-45, b is 0, c is 0,
Y is —$(CH_2)_6$— and a is 25-35 and which are terminated with a hydrogen atom on the radical A and with the radical —$NH(CH_2)_3SiMe_2(OSiMe_2)_{35-45}(CH_2)_3$—$NH_2$ on the carbonyl carbon atom;
R is $CH_3$—, X is —$(CH_2)_3$—, A is —NH—, n is 35-45, b is 0, c is 0,
Y is —$(CH_2)_6$— and a is 25-35 and which are terminated with a hydrogen atom on the radical A and with the radical —$NH(CH_2)_3SiMe_2(OSiMe_2O)_{35-45}(CH_2)_3$—NH—CO—NH—Y—NCO on the carbonyl carbon atom;
R is $CH_3$—, X is —$(CH_2)_3$—, A is —NH—, n is 35-45, b is 0, c is 0,
Y is —$(CH_2)_6$— and a is 50-70 and which are terminated with a hydrogen atom on the radical A and with the radical —$NH(CH_2)_3SiMe_2(OSiMe_2)_{35-45}(CH_2)_3$—$NH_2$ on the carbonyl carbon atom;
R is $CH_3$—, X is —$(CH_2)_3$—, A is —NH—, n is 35-45, b is 0, c is 0,
Y is —$(CH_2)_6$— and a is 50-70 and which are terminated with a hydrogen atom on the radical A and with the radical —$NH(CH_2)_3SiMe_2(OSiMe_2O)_{35-45}(CH_2)_3$—NH—CO—NH—Y—NCO on the carbonyl carbon atom;
R is $CH_3$—, X is —$(CH_2)_3$—, A is —NH—, n is 35-45, b is 0, c is 0,
Y is —$C(CH_3)_2$-m-$C_6H_4$—$C(CH_3)_2$— and a is 25-35 and which are terminated with a hydrogen atom on the radical A and with the radical —$NH(CH_2)_3SiMe_2(OSiMe_2)_{35-45}(CH_2)_3$—$NH_2$ on the carbonyl carbon atom;
R is $CH_3$—, X is —$(CH_2)_3$—, A is —NH—, n is 35-45, b is 0, c is 0,
Y is —$C(CH_3)_2$-m-$C_6H_4$—$C(CH_3)_2$— and a is 25-35 and which are terminated with a hydrogen atom on the radical A and with the radical —NH(CH$_2$)$_3$SiMe$_2$(OSiMe$_2$O)$_{35\text{-}45}$(CH$_2$)$_3$—NH—CO—NH—Y—NCO on the carbonyl carbon atom;

R is CH$_3$—, X is —(CH$_2$)$_3$—, A is —NH—, n is 35-45, b is 0, c is 0,
Y is —C(CH$_3$)$_2$-m-C$_6$H$_4$—C(CH$_3$)$_2$— and a is 50-70 and which are terminated with a hydrogen atom on the radical A and with the radical —NH(CH$_2$)$_3$SiMe$_2$(OSiMe$_2$O)$_{35\text{-}45}$(CH$_2$)$_3$—NH$_2$ on the carbonyl carbon atom;

R is CH$_3$—, X is —(CH$_2$)$_3$—, A is —NH—, n is 35-45, b is 0, c is 0,
Y is —C(CH$_3$)$_2$-m-C$_6$H$_4$—C(CH$_3$)$_2$— and a is 50-70 and which are terminated with a hydrogen atom on the radical A and with the radical —NH(CH$_2$)$_3$SiMe$_2$(OSiMe$_2$O)$_{35\text{-}45}$(CH$_2$)$_3$—NH—CO—NH—Y—NCO on the carbonyl carbon atom;

R is CH$_3$—, X is —(CH$_2$)$_3$—, A is —NH—, n is 35-45, b is 0, c is 0,
Y is -p-C$_6$H$_{10}$—CH$_2$-p-C$_6$H$_{10}$— and a is 25-35 and which are terminated with a hydrogen atom on the radical A and with the radical —NH(CH$_2$)$_3$SiMe$_2$(OSiMe$_2$)$_{35\text{-}45}$(CH$_2$)$_3$—NH$_2$ on the carbonyl carbon atom;

R is CH$_3$—, X is —(CH$_2$)$_3$—, A is —NH—, n is 35-45, b is 0, c is 0,
Y is -p-C$_6$H$_{10}$—CH$_2$-p-C$_6$H$_{10}$— and a is 25-35 and which are terminated with a hydrogen atom on the radical A and with the radical —NH(CH$_2$)$_3$SiMe$_2$(OSiMe$_2$O)$_{35\text{-}45}$(CH$_2$)$_3$—NH—CO—NH—Y—NCO on the carbonyl carbon atom;

R is CH$_3$—, X is —(CH$_2$)$_3$—, A is —NH—, n is 35-45, b is 0, c is 0,
Y is -p-C$_6$H$_{10}$—CH$_2$-p-C$_6$H$_{10}$— and a is 50-70 and which are terminated with a hydrogen atom on the radical A and with the radical —NH(CH$_2$)$_3$SiMe$_2$(OSiMe$_2$)$_{35\text{-}45}$(CH$_2$)$_3$—NH$_2$ on the carbonyl carbon atom;

R is CH$_3$—, X is —(CH$_2$)$_3$—, A is —NH—, n is 35-45, b is 0, c is 0,
Y is -p-C$_6$H$_{10}$—CH$_2$-p-C$_6$H$_{10}$— and a is 50-70 and which are terminated with a hydrogen atom on the radical A and with the radical —NH(CH$_2$)$_3$SiMe$_2$(OSiMe$_2$O)$_{35\text{-}45}$(CH$_2$)$_3$—NH—CO—NH—Y—NCO on the carbonyl carbon atom;

R is CH$_3$—, X is —(CH$_2$)$_3$—, A is —NH—, n is 140-155, b is 0, c is 0,
Y is —C(CH$_3$)$_2$-m-C$_6$H$_4$—C(CH$_3$)$_2$— and a is 50-70 and which are terminated with a hydrogen atom on the radical A and with the radical —NH(CH$_2$)$_3$SiMe$_2$(OSiMe$_2$)$_{140\text{-}155}$(CH$_2$)$_3$—NH$_2$ on the carbonyl carbon atom;

R is CH$_3$—, X is —(CH$_2$)$_3$—, A is —NH—, n is 140-155, b is 0, c is 0,
Y is —C(CH$_3$)$_2$-m-C$_6$H$_4$—C(CH$_3$)$_2$— and a is 50-70 and which are terminated with a hydrogen atom on the radical A and with the radical —NH(CH$_2$)$_3$SiMe$_2$(OSiMe$_2$)$_{140\text{-}155}$(CH$_2$)$_3$—NH—CO—NH—Y—NCO on the carbonyl carbon atom;

R is CH$_3$—, X is —(CH$_2$)$_3$—, A is —NH—, n is 140-155, b is 0, c is 0,
Y is —C(CH$_3$)$_2$-m-C$_6$H$_4$—C(CH$_3$)$_2$— and a is 20-35 and which are terminated with a hydrogen atom on the radical A and with the radical —NH(CH$_2$)$_3$SiMe$_2$(OSiMe$_2$)$_{140\text{-}155}$(CH$_2$)$_3$—NH$_2$ on the carbonyl carbon atom;

R is CH$_3$—, X is —(CH$_2$)$_3$—, A is —NH—, n is 140-155, b is 0, c is 0,
Y is —C(CH$_3$)$_2$-m-C$_6$H$_4$—C(CH$_3$)$_2$— and a is 20-35 and which are terminated with a hydrogen atom on the radical A and with the radical —NH(CH$_2$)$_3$SiMe$_2$(OSiMe$_2$)$_{140\text{-}155}$(CH$_2$)$_3$—NH—CO—NH—Y—NCO on the carbonyl carbon atom;

R is CH$_3$—, X is —(CH$_2$)$_3$—, A is —NH—, n is 35-45, Y is —(CH$_2$)$_6$—, a is 15-25, b is 15-25 and c is 0 and which are terminated with a hydrogen atom on the radical A and with the radical —NH(CH$_2$)$_3$SiMe$_2$(OSiMe$_2$O)$_{35\text{-}45}$(CH$_2$)$_3$—NH$_2$ on the carbonyl carbon atom;

R is CH$_3$—, X is —(CH$_2$)$_3$—, A is —NH—, n is 35-45, Y is —(CH$_2$)$_6$—, a is 15-25, b is 15-25 and c is 0 and which are terminated with a hydrogen atom on the radical A and with the radical —NH(CH$_2$)$_3$SiMe$_2$(OSiMe$_2$O)$_{35\text{-}45}$(CH$_2$)$_3$—NH—CO—NH—Y—NCO on the carbonyl carbon atom;

R is CH$_3$—, X is —(CH$_2$)$_3$—, A is —NH—, n is 35-45,
Y is

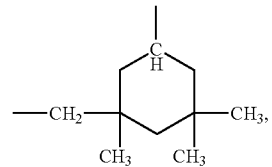

a is 15-25, b is 15-25 and c is 0 and which are terminated with a hydrogen atom on the radical A and with the radical —NH(CH$_2$)$_3$SiMe$_2$(OSiMe$_2$)$_{35\text{-}45}$(CH$_2$)$_3$—NH$_2$ on the carbonyl carbon atom, and R is CH$_3$—, X is —(CH$_2$)$_3$—, A is —NH—, n is 35-45,
Y is

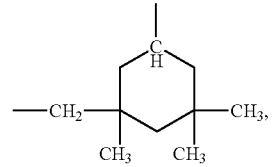

a is 15-25, b is 15-25 and c is 0 and which are terminated with a hydrogen atom on the radical A and with the radical —NH(CH$_2$)$_3$SiMe$_2$(OSiMe$_2$O)$_{35\text{-}45}$(CH$_2$)$_3$—NH—CO—NH—Y—NCO on the carbonyl carbon atom.

As a result of the interplay of siloxane content, chain length of the siloxane polymer, and content of urethane or urea groups, the softening point of the thermoplastic siloxane copolymers of the formula (1) can be precisely adjusted. The thermoplastic siloxane copolymer of the layer (B), which is used according to the invention, preferably has a softening point of at least 40° C., but more preferably in the range of from 100 to 180° C. at the pressure of the ambient atmosphere, i.e. from 900 to 1100 hPa.

Preferably, the thermoplastic siloxane copolymers of the general formula (1) have a siloxane content of from 50 to 99.9% by weight, more preferably from 80 to 98% by weight, and in particular from 90 to 95% by weight.

The weight-average molecular weight $M_w$ of the thermoplastic siloxane copolymers of the formula (1) is preferably from 10,000 to 10·10$^6$ g/mol, more preferably from 30,000 to 10$^6$ g/mol, and in particular from 50,000 to 500.000 g/mol.

In order to ensure a high long-term stability of the adhesive bond according to the invention, layer (B) must compensate the forces which occur as a result of the different coefficients of thermal expansion of, for example, window glass (7.5·10$^6$ K$^{-1}$), but in particular industrial plastics (from 50 to 150·10$^{-6}$ K$^{-1}$), relative to, for example, silicon (2·10$^{-6}$ K$^{-1}$) during the heating and cooling cycles in the production and operation of a solar module. On the one hand, good mechanical properties are required for this purpose. On the other hand, layer (B) must not be too soft but must have a certain hardness and rigidity, which can be characterized, for example, by the modulus of elasticity. Layers (B) having too high a modulus of elasticity are, however, likewise to be avoided since these are then too hard and the fragile solar cell units break on thermal expansion. For the layer (B), it is therefore necessary to find a balanced compromise between mechanical stability, hardness and modulus of elasticity, as is possible, for example, by the use of the thermoplastic siloxane copolymers of the formula (1).

The hardness of the thermoplastic siloxane copolymers (B) used according to the invention is therefore preferably in the medium range of the Shore A scale, i.e. copolymers having a hardness according to DIN 53505 of from 20 to 80 Shore A, in particular from 30 to 60 Shore A, are preferred.

The modulus of elasticities of the thermoplastic copolymers used according to the invention preferably have values of up to 3 N/mm$^2$, more preferably from 0.5 to 2.5 N/mm$^2$, at 100% elongation according to DIN 53504 S2 at room temperature.

The tensile strength of the thermoplastic copolymers used according to the invention is, according to DIN 53504 S2, preferably at least 1.5 N/mm$^2$, more preferably at least 3 N/mm$^2$, and in particular at least 4.5 N/mm$^2$.

The tear propagation resistance of the thermoplastic copolymers used according to the invention is, according to ASTM 624 B, preferably at least 10 N/mm, and more preferably at least 20 N/mm.

The thermoplastic siloxane copolymers used according to the invention typically have a refractive index of from 1.4 to 1.45. By introducing phenyl radicals into the siloxane moiety of the copolymer, however, refractive indices of up to 1.5 can also be reached.

The coefficient of thermal expansion of the thermoplastic siloxane polymers at room temperature is preferably from $100 \cdot 10^{-6}$ to $750 \cdot 10^{-6}$ K$^{-1}$, more preferably from $250 \cdot 10^{-6}$ to $500 \cdot 10^{-6}$ K$^{-1}$.

The layer (B) may consist of a uniform material or may even have a multilayer structure comprising different layers of the thermoplastic siloxane copolymer or may be a laminate of different types of polymers, of which at least one must consist of the thermoplastic siloxane copolymer.

The units (C) used according to the invention contain one or more layers of a photosensitive semiconductor which may be present in amorphous, monocrystalline, microcrystalline or polycrystalline form and in combinations thereof. Suitable semiconductor layers are, for example, those which are based on amorphous, monocrystalline, microcrystalline or polycrystalline silicon, gallium arsenide, copper indium disulfide, copper indium diselenide, copper indium gallium diselenide, cadmium telluride or other semiconducting elements and combinations of elements. Units (C) of the type described are generally known and are described, for example, in Ullmann's Encyclopedia of Industrial Chemistry, 5th edition, 1992, vol. A20, pages 164-175.

For optimizing the luminescence efficiency, the semiconductor layers may additionally be provided with a special surface structure or an antireflective coating (so-called AR coating) based on, for example, titanium dioxide, silica, silicon nitrides or the like, with the result that any losses of efficiency due to reflection are reduced. The production of textured surfaces of semiconductor layers is described by way of example in DE 10352423 B3. DE 19919742 A1 discloses methods for producing antireflective coatings. In the context of the present invention, both methods for modifying the semiconductor layers are equally preferred.

The unit (C) may be present both as an independent structure and in supported form on a support material, for example glass or films of organic polymers.

The unit (C) can be connected to one or more photovoltaic cells by known methods in a suitable manner via contacting tracks, the term photovoltaic cell in the context of the present invention being intended to include all assemblies which, while utilizing the photovoltaic effect, are capable of converting light into electrical current. In addition, it is possible to connect a plurality of photovoltaic cells to one another to give groups (so-called solar cell strings), which can be effected by any method of the prior art, for example by soldering, pressing or adhesive bonding with the aid of conductive adhesives.

The laminate according to the invention can optionally contain further layers (D) which are preferably selected from the group consisting of metallic materials, mineral materials, organic and organosilicon polymers such as polyvinyl butyral, polyurethanes, polyureas, polyvinyl chloride, epoxides, polyester, (meth)acrylates, polyethylene, polyvinyl acetate, polypropylene, PVC, polystyrene, polycarbonate, polymers of fluorinated organic hydrocarbons, silicones, silicone resin polymers, modified silicone polymers, hotmelt adhesives, coatings, sealants and plastisols, and mixtures, copolymers and laminates thereof, the material of layer (D) differing from that of the layers (A), (B) and (C).

Suitable organic polymers are, for example, polyvinyl fluoride (PVF) and colaminates thereof with polyethylene terephthalate (PET) (for example, those which are obtainable under the brand names TEDLAR® from DuPont). Suitable silicones are, for example, UV- or hot-crosslinking silicones, cold-crosslinking 2-component silicones and moisture-crosslinking silicones having a transmittance$_{D65}$ (according to DIN 5036, Part 3) of less than 80%. Suitable metallic materials are, for example, aluminum sheets and films and colaminates thereof, such as PVF/aluminum/PVF or PVF/aluminum/PET laminated films.

The optional further layers (D) are more preferably organic polymers and laminates thereof with one another and laminates thereof with metallic materials.

The laminate according to the invention preferably has at least one layer (D).

The laminate according to the invention has a sandwich-like structure and can have in each case one or more layers from each of the layers (A), (B), (C) and optionally (D). For example, the laminate may additionally contain further layers (B) in order, for example, to bond layer (C) to an additionally present layer (D) or to a second layer (A).

In a preferred embodiment, the laminate according to the invention contains a layer (A) comprising inorganic glass, a layer (B) of the thermoplastic siloxane copolymer and a unit (C) containing at least one photosensitive layer.

In a further preferred embodiment, the laminate according to the invention contains a layer (A) comprising organic glass, a layer (B) of the thermoplastic siloxane copolymer and a layer (C) consisting of at least one photosensitive semiconductor layer.

In a particularly preferred embodiment, the laminate contains at least one further additional layer comprising inorganic or organic glass (A) or metallic materials or organic polymers and copolymers (D). If layer (D) is present in the laminate, it is preferably present in film form, layer (D) most preferably being a laminated film.

The layer (A) preferably has a layer thickness of more than 1 µm. Layer thicknesses of from 10 µm to 20 mm are particularly preferred.

The layer (B) preferably has a layer thickness of preferably more than 1 µm, a layer thickness of from 10 µm to 3 mm being more preferred. In particular, the layer thickness is from 10 µm to 1 mm.

The layer (C) preferably has a layer thickness of more than 1 µm, a layer thickness of from 5 µm to 10 mm being particularly more preferred. In particular, the layer thickness is from 10 µm to 2 mm.

The optionally present further layers (D) preferably have layer thicknesses of more than 1 µm, in each case a layer thickness of from 10 µm to 20 mm being particularly preferred.

The laminates according to the invention preferably have a thickness of from 12 µm to 100 mm, more preferably from 20 µm to 50 mm, and in particular from 20 µm to 30 mm.

The laminates according to the invention have good optical quality owing to the good adhesion of (B) to (A) or (B) to (C), as well as owing to the outstanding properties of (B), in particular with respect to water.

For improving adhesion, adhesion-promoting silanes such as silanes having hydrolyzable groups and SiC-bonded vinyl, acryloyloxy, methacryloyloxy, isocyanato, epoxy, acid anhydride, acid, ester or ether groups and partial and mixed hydrolysis products thereof, may be added to the thermoplastic siloxane copolymer of layer (B).

Examples of optionally used adhesion promoters are 3-isocyanatopropyltrimethoxysilane, 3-isocyanatopropyltriethoxysilane, 3-isocyanatopropyldimethoxymethylsilane, 3-isocyanatopropyldiethoxymethylsilane, 3-isocyanatopropylmethoxydimethylsilane, 3-isocyanatopropylethoxydimethylsilane, isocyanatomethyltrimethoxysilane, isocyanatomethyltriethoxysilane, isocyanatomethyldimethoxymethylsilane, isocyanatomethyldiethoxymethylsilane, isocyanatomethylmethoxydimethylsilane and isocyanatomethylethoxydimethylsilane, 3-aminopropyltrimethoxysilane, 3-aminopropyltriethoxysilane, 3-(2-aminoethyl)aminopropyltrimethoxysilane, 3(2-aminoethyl)aminopropyltriethoxysilane, 3-aminopropylmethyldimethoxysilane, 3-(2-aminoethyl)aminopropylmethyldimethoxysilane, cyclohexylaminomethyltriethoxysilane, glycidyloxypropyltrimethoxysilane and glycidyloxypropyltriethoxysilane.

If an adhesion promoter is used in component (B), silanes having vinyl groups and silanes having epoxy groups which also contain ethoxy and acetoxy groups as hydrolyzable radicals are preferred, glycidyloxypropyltriethoxysilane, vinyltriethoxysilane and vinyltriacetoxysilane and/or the partial and mixed hydrolysis products thereof being particularly preferred.

If an adhesion promoter is used, the amounts are preferably from 0.01 to 5% by weight, more preferably from 0.1 to 2% by weight, and in particular from 0.4 to 0.7% by weight, based in each case on the total mass of component (B). The optionally used adhesion promoter may be simply mixed with the thermoplastic silicon copolymer, but the adhesion-promoting silanes, hydrolysis products or condensates thereof or solutions thereof in organic solvents can also be applied to the surface of films produced from the thermoplastic siloxane copolymers.

Preferably, adhesion-promoting silanes are applied to the film comprising thermoplastic siloxane copolymer, to the layer (A), to the layer (C) and/or to the optionally used further layer (D). The application of the adhesion-promoting silanes is effected by known methods before the production of the laminate. The terms "priming" and "undercoating" have become established for this method.

In addition, further additives can be added to the thermoplastic siloxane copolymer, provided that they do not adversely change the optical properties. Examples of suitable additives are dyes, pigments, fillers, catalysts, heat stabilizers, plasticizers, crosslinking agents, flame-proofing agents and light stabilizers and mixtures thereof. Such additives are known to the person skilled in the art from polyurethane and silicone chemistry and can be simply mixed with the siloxane copolymer.

The organic polymers of layer (D) and the organic glasses of layer (A) may also contain additives. All these additives may be material-specific and are known to the person skilled in the art.

The production of the laminate according to the invention between the layers (A), (B) and (C) and optionally between the layers (C), (B) and (D) can be effected by processes known per se.

There is in principle a plurality of possibilities for the production of the laminate according to the invention. One possibility consists in applying liquefied thermoplastic siloxane copolymer to layer (A) by, for example, knife coating, roll-coating or screen printing, with the result that layer (B) is produced in situ in situ after cooling. The laminate according to the invention is then produced by placing the layer (C) on the still liquid layer (B) and pressing to give a laminate. It is of course also possible first to apply the liquefied layer (B), as described above, to layer (C), then to place layer (A) on the layer (B) and thereafter to bond all layers by pressing to give a laminate.

The second possibility consists in applying the thermoplastic siloxane copolymer (B) liquefied with solvent to layer (A) by, for example, knife coating, roll-coating or screen printing and then evaporating the solvent. Layer (C) is then placed on the double layer thus obtained and comprising layers (A) and (B). The laminate according to the invention is then obtained by increasing the temperature until the thermoplastic siloxane copolymer of layer (B) softens, while simultaneously pressing the laminate. Of course, it is also possible in this procedure first to apply the thermoplastic siloxane copolymer of layer (B), which has been liquefied with solvent, to layer (C), then to place layer (A) on layer (B) and thereafter to bond all layers by pressing to give a laminate.

A third possibility consists in combining the two layers (A) and (C) by means of suitable spacers so that a gap of defined width is obtained. Liquefied thermoplastic siloxane copolymer of layer (B) is then introduced into this gap from a suitable heated storage vessel by a metering device, the edges of the layers (A) and (C) being closed so that the polymer melt does not emerge at undesired points and only the air present between the layers (A) and (C) can escape.

The preferred, fourth possibility for the production of the laminate glass consists in producing layer (B) containing thermoplastic siloxane copolymer as a film. An embossed film having a defined surface roughness (texture) is preferably used in order to minimize air inclusions during lamination. The laminate is then obtained by placing the film layer (B) between the layers (A) and (C) and permanently bonding the layers (A) and (C) to one another by means of pressure and temperature.

If one or more layers, such as, for example, layer (D), are present, the production of the laminate can be effected, for example, between the layers (C) and (D) by means of layer (B) in the same manner as described above for the laminate between the layers (A) and (C). In all of the cases described above, a pretreatment of the layers (A), (B), (C) and/or (D) with adhesion promoters can of course be effected.

The laminate production according to the invention can be effected either by producing a layer structure stepwise, i.e. first producing one or more laminated layers, e.g. from layer (A) and layer (B) or optionally layer (B) and layer (D), and then laminating the laminated layers with layer (C), or in a single lamination step.

The laminates according to the invention can be produced both with the aid of batch laminators, as are used in the production of solar modules, and with the aid of roll laminators. The latter have the advantage of continuous operation and, if the glasses of the layer (A) and optionally layer (D) are present in film form, the production of theoretically endless laminates.

The preferred process for the production of the laminates according to the invention is characterized in that
in a 1st step layer (B) is produced from a thermoplastic siloxane copolymer and optionally further additives in the form of a film having a thickness preferably of from 0.1 to 3 mm,
in a 2nd step the film layer (B) obtained in the 1st step is placed between the layers (A) and (C) and optionally (C) and (D) to be laminated, and
in a 3rd step the individual layers are bonded at a temperature which is preferably from 10 to 50° C. above the softening temperature of the thermoplastic siloxane copolymer, and at a pressure which is preferably from the pressure of the ambient atmosphere, i.e. about 1000 hPa, to 20,000 hPa to provide a laminate.

Preferably, the film of the thermoplastic siloxane copolymer which is produced in the 1st step has a surface texture typical for laminate films, the texturing of the film surface being effected during film production and according to the prior art.

Most preferably, the laminating temperature in the 3rd step of the process according to the invention is from 20 to 40° C. above the softening temperature of the thermoplastic siloxane copolymer, i.e. preferably from 60 to 250° C., more preferably from 100 to 200° C., and most preferably from 120 to 180° C.

Preferably, the laminating pressure in the 3rd step is not more than 10,000 hPa.

The duration of the process according to the invention is preferably from 5 seconds to 60 minutes, more preferably from 15 seconds to 30 minutes, and in particular from 1 to 20 minutes.

The production of the films containing thermoplastic siloxane copolymers in principle are known processes. Examples of suitable film production processes are film extrusion blowing, chill-roll extrusion, the casting process and the coextrusion process, as described, for example, in Ullmann's Encyclopedia Of Industrial Chemistry, 5th edition, 1988, vol. A11, pages 87-93.

The laminates according to the invention are preferably used for the production of photovoltaic solar modules, it then being possible for these to contain additional structural components, such as, for example, cabling, frame parts, module holders, electrical and electronic components.

In a particular embodiment, the laminates according to the invention have sound-absorbing properties and properties similar to glazing comprising laminated safety glass, so that they can be used as a facade component, roof surface, conservatory covering, sound-insulating wall, balcony or parapet element, as part of window areas or as a design element in the architecture of converted areas and rooms.

The laminates according to the invention have a number of advantages. Firstly, the copolymer layer (B) has a very high transparency over a wide spectral range, in particular in the working ranges relevant for, for example, solar cells based on silicon, which results in a high solar energy efficiency. Like all silicone-based systems, the copolymer layer (B) has long-term UV stability. Therefore advantageously, in contrast to, for example, the films comprising EVA and PVB, no UV stabilizers need be added to films containing component (B), which UV stabilizers could subsequently lead to disadvantageous effects, such as yellowing and cloudiness. Furthermore, the polymer layer (B)—in contrast to PVB—is highly hydrophobic and has a specifically adjustable, excellent adhesion to all relevant substrates, such as, for example, glass, industrial plastics and the solar cell units. Delamination effects therefore generally do not occur even at the temperatures usually prevailing during operation of a solar module.

Compared to laminates comprising embedding materials according to the prior art, the laminates according to the invention comprising copolymer layer (B) also have process engineering advantages. Firstly, processing of films containing thermoplastic silicone copolymers is simple to carry out and similar to the production of laminated safety glass. In contrast to organic casting resins or EVA, further process auxiliaries, such as catalysts or crosslinking agents, which may make the process complicated and the laminate susceptible to subsequent damage, are also unnecessary. In contrast to the production of EVA-containing laminates, specific vacuum lamination apparatuses are also unnecessary. The adhesive bonding to the thermoplastic block copolymer (B) is moreover reversible; any laminating errors can therefore be corrected in a simple manner immediately after laminate production.

A further advantage of the laminates according to the invention is their easy recyclability. While the expensive solar cell units comprising laminates with postcrosslinked EVA, crosslinked silicones or infusible organic casting resins can be recovered only in an inconvenient manner via pyrolytic multistage processes and moreover have to pass through complicated purification processes, the laminates according to the invention can be delaminated by simple melting of the copolymer layer (B) at elevated temperature. The solar cell units thus recovered need then only be cleaned with alcohol, such as, for example, isopropanol, to remove any adhering copolymer (B) and can then be recycled directly to the reusable material circulation. The laminates according to the invention are accordingly permanently environmentally compatible and resource-protecting not only in their production but also in their reuse.

The completely reversible melting behavior of the copolymers (B) gives rise to a further advantage of the laminates according to the invention. In contrast to solar modules comprising EVA, organic casting resins or crosslinked silicones as the adhesive layer, solar modules containing block copolymers (B) can be repaired easily on site by melting on, delamination and relamination, for example in the case of failure of an individual solar module unit. Such an in-field repair can be carried out, for example, by the builder of the solar installation himself; corrective measures by the solar module producer are necessary only in exceptional cases.

Furthermore, the laminates according to the invention have the advantage that they have high flexibility to well below 0° C.

In the following examples, all data relating to parts and percentages are based on weight, unless stated otherwise. Unless stated otherwise, the following examples are carried out at a pressure of the ambient atmosphere, i.e. at about 1000 hPa, and at room temperature, i.e. about 20° C., or at a temperature which is established when combining the reactants at room temperature without additional heating or cooling. All viscosity data mentioned in the examples are to be based on a temperature of 25° C.

The tear propagation resistance is determined according to ASTM D624-B-91 (or ISO 34, Method C).

The tensile strength is determined according to DIN 53504-85S1.

The elongation at break is determined according to DIN 53504-85S1.

The Shore A hardness is determined according to DIN (Deutsche Industrie Norm [German Industrial Standard]) 53505 (August 2000 edition).

Tensile strength, elongation at break and modulus (stress at 100% elongation) were determined according to DIN 53504 (May 1994 edition) on test specimens of shape S2.

EXAMPLE 1 a) Production of the Film B1

A film was produced by the chill-roll process from a thermoplastic siloxane copolymer containing urea groups and having a siloxane content of 92% by weight, a weight average molecular weight $M_w$ of about 120,000 g/mol and a softening point of about 125° C., obtainable from Wacker Chemie AG under the trade name GENIOMER® 140. For this purpose, the raw material obtainable in granular form was extruded by means of a screw extruder directly onto the chill roll of a downstream roll unit, the following machine configuration being used:

| | |
|---|---|
| Zone 1 (feed): | 70° C. |
| Zones 2 and 3: | 170° C. |
| Zones 4 to 7: | 195° C. |
| Zones 8 and 9: | 170° C. |
| Zone 10 (die): | 170° C. |
| Speed of the extruder: | 30 rpm |
| Extrusion rate: | 50 kg/h |

Controllable sheet die, vertical die arrangement, width about 60 cm;
Temperature of the chill roll: 15° C.
Take-off speed: about 3.5 m/min.

The slot width of the sheet die was adjusted, or was adapted by an automatic layer thickness measurement, in such a way that a film thickness of 0.38 mm resulted. Furthermore, the roll unit contained an embossing roll, with the aid of which the film was provided with a specific surface texture. After cutting to a width of 50 cm, the film thus produced was rolled up to give a film roll.

b) Production of the Film B2

A PE film laminate comprising the thermoplastic siloxane copolymer which contains urea groups and is described above under a) was produced by coextrusion analogously to the production of film B1.

For this purpose, a film laminate was produced by the chill-roll process by laminating the siloxane raw material obtainable in granular form by means of a screw extruder directly on a likewise extruded LDPE film and passing the laminate over the chill roll of a downstream roll unit, the following machine configuration being used:
GENIOMER® extrusion by means of 1-screw extruder having 10 heating zones:

| | |
|---|---|
| Zone 1 (feed): | 70° C. |
| Zones 2 and 3: | 170° C. |
| Zones 4 to 7: | 195° C. |
| Zones 8 and 9: | 170° C. |
| Zone 10 (die): | 170° C. |
| Speed of the extruder: | 30 rpm |
| Extrusion rate: | 50 kg/h |

Controllable sheet die, vertical die arrangement, width about 60 cm;
Temperature of the chill roll: 15° C.
Take-off speed: about 3.5 m/min.

LDPE extrusion by means of 1-screw extruder having 10 heating zones:

| | |
|---|---|
| Zone 1 (feed): | 70° C. |
| Zones 2 and 3: | 190° C. |
| Zones 4 to 7: | 195° C. |
| Zones 8 and 9: | 180° C. |
| Zone 10 (die): | 175° C. |
| Speed of the extruder: | 30 rpm |
| Extrusion rate: | 8 kg/h |

Controllable sheet die, vertical die arrangement, width about 60 cm;
Temperature of the chill roll: 15° C.
Take-off speed: about 3.5 m/min.

The slot width of the sheet die was adjusted, or was adapted by an automatic layer thickness measurement, in such a way that a total film thickness of 0.45 mm resulted. Furthermore, the roll unit contained an embossing roll, with the aid of which the GENIOMER® layer was provided with a specific surface texture. After cutting to a width of 50 cm, the film thus produced was rolled up to give a film roll.

A commercially available solar cell comprising polycrystalline silicon and having the dimensions 10 cm×10 cm was completely covered with the thermoplastic siloxane copolymer film B1 produced above under a). The film was then pressed lightly onto the solar cell so that any air enclosed between film and solar cell could escape completely. Low-iron flat glass, as is obtainable, for example, under the trade name AFG Solatex from Interfloat Corporation, Liechtenstein, having the dimensions 10 cm×10 cm and a thickness of 0.4 cm, was then placed on the thermoplastic siloxane copolymer film layer and lightly pressed onto the film layer so that any air bubbles enclosed between glass and film could escape completely. Thereafter, the sandwich was heated while being loaded with a weight of 500 g in a hot-air oven for 15 minutes at 160° C. After removal from the oven and cooling of the solar cell laminate, the current flow generated by the solar cell was measured and compared.

| | |
|---|---|
| Pure solar cell (100 cm²): | 100% |
| Solar cell + low-iron glass: | 95% |
| Solar cell + thermoplastic siloxane copolymer layer B1 + low-iron glass: | 94% |

The solar cell was adhesively bonded to the glass layer without cracking and fracture by means of the thermoplastic siloxane copolymer layer. The bond between glass, thermoplastic siloxane copolymer B1 and solar cell was completely transparent (transparency of the thermoplastic adhesive layer: about 99%), bubble-free and of high strength.

EXAMPLE 2

Analogously to Example 1, a laminate was produced which, in addition to the layers mentioned in Example 1, also contained a further glass layer and a layer of thermoplastic siloxane copolymer B1, i.e. had the following formal structure:

Low-iron glass/thermoplastic siloxane copolymer layer B1/solar cell/thermoplastic siloxane copolymer layer B1/low-iron glass.

The solar module thus obtained and having a laminate-like structure likewise gave a current which corresponded to 94% of the current of the unlaminated, pure solar cell (100 cm$^2$). The bond between solar cell and the glass layers was of high strength and could be separated mechanically only with application of an extremely high force and a destruction of the glass layers.

EXAMPLE 3

Analogously to Example 1, a laminate having the following formal structure was produced with additional use of a PVF/PET/PVF colaminate film, as is obtainable, for example, under the brand name Icosolar®-2442 from Isovolta AG, having dimensions of 10 cm×10 cm and a thickness of 0.35 mm:

PVF/PET/PVF colaminate film layer/thermoplastic siloxane copolymer layer B1/solar cell/thermoplastic siloxane copolymer layer B1/low-iron glass.

The solar module thus obtained and having a laminate-like structure gave a current which corresponded to 94% of the current of the unlaminated, pure solar cell (100 cm$^2$). The bond between solar cell and the PVF/PET/PVF colaminate film was of high strength and could be separated mechanically only with application of an extremely high force.

EXAMPLE 4

Analogously to Example 1, a laminate having the formal structure Fluon® ETFE/thermoplastic siloxane copolymer layer B2'/solar cell string/thermoplastic siloxane copolymer layer B2'/PVF/PET/PVF colaminate film was produced with the aid of a roll laminator and with the use of three commercially available solar cell strings present parallel and side by side and consisting of in each case 12 solar cells (polycrystalline silicon, dimensions 10×10 cm each), the thermoplastic siloxane copolymer film B2 produced under 1b), a PE/PTFE copolymer film corona-treated on one side, as is obtainable, for example, under the brand name Fluon® ETFE from Asahi Glass Co., Ltd., Japan, and an additional PVF/PET/PVF colaminate film, as is obtainable, for example, under the brand name Icosolar®-2442 from Isovolta AG. The corona-treated side of the PE/PTFE copolymer film came to rest so that it faced the side of the thermoplastic siloxane copolymer layer. Furthermore, before entry into the roll laminator, the LDPE fraction of the GENIOMER® coextrusion film B2 described under 1b) was removed on unwinding from the film roll via a deflection roller (B2'). The temperature of the laminating rolls was 160° C., the rolls had a nip of 1.2 mm and the feed velocity of the roll laminator was 0.15 m/min, so that the laminate according to the invention, having a width of 50 cm and a length of about 130 cm, could be produced in about 9 minutes.

The solar module thus obtained and having a laminate-like structure gave a current which corresponded to 94% of the current of the unlaminated, pure solar cell strings (3600 cm$^2$). The bond between the individual layers was of high strength and could be separated mechanically only with application of an extremely high force.

The invention claimed is:

1. A laminate comprising
    (A) at least one layer containing inorganic and/or organic glass,
    (B) at least one layer containing a thermoplastic siloxane copolymer,
    (C) at least one photosensitive semiconductor layer, and
    (D) optionally, one or more further layers of organic polymers, organosilicon polymers, metallic materials, mineral materials or wood,
wherein the thermoplastic siloxane copolymer of layer (B) comprises compounds of the formulae

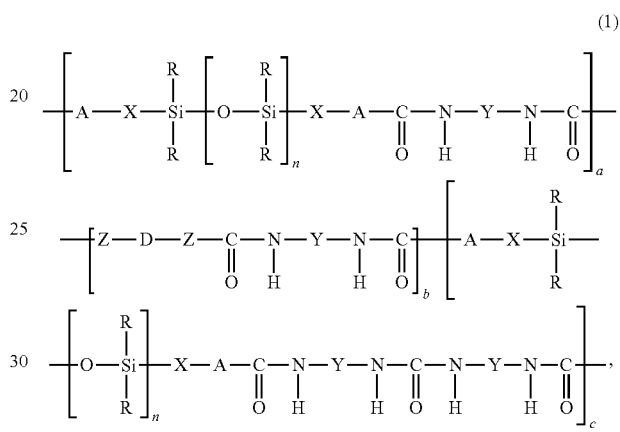

in which

R are identical or different and are monovalent, Si-bonded hydrocarbon radicals optionally substituted by halogen atoms and optionally interrupted by non-adjacent oxygen atoms X are identical or different and are alkylene radicals having 1 to 20 carbon atoms, in which non-adjacent methylene units may be replaced by —O— groups, A are identical or different and are oxygen or an amino group —NR'—, Z are identical or different and are oxygen or an amino group —NR'—, R' are identical or different and are hydrogen or an alkyl radical having 1 to 10 carbon atoms, Y are identical or different and are divalent hydrocarbon radicals which have 1 to 20 carbon atoms, optionally substituted by halogen atoms and optionally interrupted by non-adjacent oxygen atoms, D are identical or different and are divalent hydrocarbon radicals optionally substituted by halogen atoms or $C_1$-$C_6$-alkyl ester groups and in which non-neighboring methylene units are optionally replaced by —O—, —COO—, —OCO— or —OCOO— groups, n are identical or different and are numbers from 1 to 4000, a is a number of at least 1, b is 0 or a number from 1 to 1000, and c is 0 or a number from 1 to 1000.

2. The laminate of claim 1, wherein the thermoplastic siloxane copolymer of layer (B) comprises compounds of the formulae

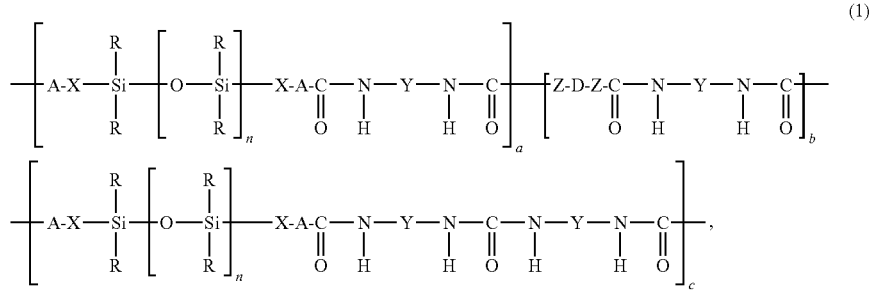

(1)

in which

R are identical or different and are monovalent, Si-bonded hydrocarbon radicals optionally substituted by halogen atoms and optionally interrupted by non-adjacent oxygen atoms, X are identical or different and are alkylene radicals having 1 to 20 carbon atoms, in which non-adjacent methylene units may be replaced by —O— groups, A are identical or different and are oxygen or an amino group —NR'—, Z are identical or different and are oxygen or an amino group —NR'—, R' are identical or different and are hydrogen or an alkyl radical having 1 to 10 carbon atoms, Y are identical or different and are divalent hydrocarbon radicals which have 1 to 20 carbon atoms, optionally substituted by halogen atoms and optionally interrupted by non-adjacent oxygen atoms, D are identical or different and are divalent hydrocarbon radicals optionally substituted by halogen atoms or $C_1$-$C_6$-alkyl ester groups and in which non-neighboring methylene units are optionally replaced by —O—, —COO—, —OCO— or —OCOO— groups, n are identical or different and are numbers from 1 to 4000, a is a number of at least 1, b 1 to 1000, and c 1 to 1000.

3. The laminate of claim 1, wherein the thermoplastic siloxane copolymer of the layer (B) has a softening point of at least 40° C. at a pressure of from 900 to 1100 hPa.

4. The laminate of claim 2, wherein the thermoplastic siloxane copolymer of the layer (B) has a softening point of at least 40° C. at a pressure of from 900 to 1100 hPa.

5. The laminate of claim 1, wherein the thermoplastic siloxane copolymer of the layer (B) has a softening point of from 100 to 180° C. at a pressure of from 900 to 1100 hPa.

6. The laminate of claim 2, wherein the thermoplastic siloxane copolymer of the layer (B) has a softening point of from 100 to 180° C. at a pressure of from 900 to 1100 hPa.

7. The laminate of claim 1, wherein the modulus of elasticity of the thermoplastic copolymer has a value of up to 3 $N/mm^2$ at 100% elongation at room temperature.

8. The laminate of claim 2, wherein the modulus of elasticity of the thermoplastic copolymer has a value of up to 3 $N/mm^2$ at 100% elongation at room temperature.

9. The laminate of claim 5, wherein the modulus of elasticity of the thermoplastic copolymer has a value of up to 3 $N/mm^2$ at 100% elongation at room temperature.

10. The laminate of claim 1, wherein at least one layer (D) is present and is selected from the group consisting of metallic materials, mineral materials, organic and organosilicon polymers and mixtures, copolymers and laminates thereof.

11. A process for the production of a laminate of claim 1, comprising in a 1st step, producing a layer (B) from a thermoplastic siloxane copolymer and optionally further additives in the form of a film, in a 2nd step, placing the film layer (B) obtained in the 1st step between layers (A) and (C) and optionally (C) and (D) to be laminated, and in a 3rd step, bonding the individual layers to give a laminate.

12. The process of claim 11, wherein the 3rd step is carried out at a temperature which is from 10 to 50° C. above the softening temperature of the thermoplastic siloxane copolymer used and at a pressure from about 1000 hPa to 20,000 hPa.

* * * * *